United States Patent
Bongiovi

(10) Patent No.: US 8,472,642 B2
(45) Date of Patent: *Jun. 25, 2013

(54) PROCESSING OF AN AUDIO SIGNAL FOR PRESENTATION IN A HIGH NOISE ENVIRONMENT

(76) Inventor: Anthony Bongiovi, Port St. Lucie, FL (US)

( * ) Notice: Subject to any disclaimer, the term of this patent is extended or adjusted under 35 U.S.C. 154(b) by 908 days.

This patent is subject to a terminal disclaimer.

(21) Appl. No.: 12/415,530

(22) Filed: Mar. 31, 2009

(65) Prior Publication Data

US 2009/0220108 A1    Sep. 3, 2009

Related U.S. Application Data

(63) Continuation of application No. 11/764,446, filed on Jun. 18, 2007, now Pat. No. 7,519,189, which is a continuation of application No. 10/914,234, filed on Aug. 10, 2004, now Pat. No. 7,254,243.

(51) Int. Cl.
*H03G 5/00* (2006.01)
*H03G 7/00* (2006.01)

(52) U.S. Cl.
USPC ............. 381/103; 381/98; 381/106; 333/28 R

(58) Field of Classification Search
USPC .. 381/57, 98, 102–109; 333/14, 28 R; 455/72
See application file for complete search history.

(56) References Cited

U.S. PATENT DOCUMENTS

| | | |
|---|---|---|
| 4,162,462 A | 7/1979 | Endoh et al. |
| 4,184,047 A | 1/1980 | Langford |
| 4,353,035 A | 10/1982 | Schroder |
| 4,356,558 A | 10/1982 | Owen et al. |
| 4,363,007 A | 12/1982 | Haramoto et al. |
| 4,517,415 A | 5/1985 | Laurence |
| 4,538,297 A | 8/1985 | Waller, Jr. |
| 4,584,700 A | 4/1986 | Scholz |
| 4,612,665 A | 9/1986 | Inami et al. |
| 4,677,645 A | 6/1987 | Kaniwa et al. |
| 4,696,044 A | 9/1987 | Waller, Jr. |
| 4,701,953 A | 10/1987 | White |
| 4,704,726 A | 11/1987 | Gibson |
| 4,739,514 A | 4/1988 | Short et al. |
| 4,815,142 A | 3/1989 | Imreh |

(Continued)

FOREIGN PATENT DOCUMENTS

| | | |
|---|---|---|
| AU | 2005274099 B2 | 2/2006 |
| JP | 3-150910 | 6/1991 |

(Continued)

OTHER PUBLICATIONS

"NovaSound International Inc", http://novasoundint.com, 2004.

*Primary Examiner* — Xu Mei
(74) *Attorney, Agent, or Firm* — Malloy & Malloy, P.L.

(57) ABSTRACT

In accordance with the invention, audio signals are specially processed for sound presentation in a high noise environment. The electrical signal representative of the sound is first subjected to equalization to preferentially reduce the magnitude of bass signals while increasing the magnitude of treble signals. The equalized signal is then compressed, and the compressed signal is subjected to "mirror image" equalization which increases the magnitude of bass signals while reducing the magnitude of treble signals. The resulting signal fed to the speakers provides a sound presentation of compressed volume range and a bass-rich sound spectrum. It is particularly useful for providing quality sound presentation in a high noise environment.

16 Claims, 6 Drawing Sheets

U.S. PATENT DOCUMENTS

| | | |
|---|---|---|
| 4,856,068 A | 8/1989 | Quatieri, Jr. et al. |
| 4,887,299 A | 12/1989 | Cummins et al. |
| 5,133,015 A | 7/1992 | Scholz |
| 5,210,806 A | 5/1993 | Kihara et al. |
| 5,361,381 A | 11/1994 | Short |
| 5,463,695 A | 10/1995 | Werrbach |
| 5,465,421 A | 11/1995 | McCormick et al. |
| 5,572,443 A | 11/1996 | Emoto et al. |
| 5,617,480 A | 4/1997 | Ballard et al. |
| 5,640,685 A | 6/1997 | Komoda |
| 5,699,438 A | 12/1997 | Smith et al. |
| 5,832,097 A | 11/1998 | Armstrong et al. |
| 5,872,852 A | 2/1999 | Dougherty |
| 5,990,955 A | 11/1999 | Koz |
| 6,078,670 A | 6/2000 | Beyer |
| 6,108,431 A | 8/2000 | Bachler |
| 6,263,354 B1 | 7/2001 | Gandhi |
| 6,285,767 B1 | 9/2001 | Klayman |
| 6,292,511 B1 | 9/2001 | Goldston et al. |
| 6,317,117 B1 | 11/2001 | Goff |
| 6,318,797 B1 | 11/2001 | Bohm et al. |
| 6,535,846 B1 | 3/2003 | Shashoua |
| 6,871,525 B2 | 3/2005 | Withnall et al. |
| 6,907,391 B2 | 6/2005 | Bellora et al. |
| 7,006,653 B2 | 2/2006 | Guenther |
| 7,016,746 B2 | 3/2006 | Wiser et al. |
| 7,058,463 B1 | 6/2006 | Ruha et al. |
| 7,123,728 B2 | 10/2006 | King et al. |
| 7,254,243 B2 | 8/2007 | Bongiovi |
| 7,266,205 B2 | 9/2007 | Miller |
| 7,274,795 B2 | 9/2007 | Bongiovi |
| 7,519,189 B2 | 4/2009 | Bongiovi |
| 7,613,314 B2 | 11/2009 | Camp, Jr. |
| 7,676,048 B2 | 3/2010 | Tsutsui |
| 7,778,718 B2 | 8/2010 | Janke et al. |
| 2003/0035555 A1 | 2/2003 | King et al. |
| 2003/0112088 A1 | 6/2003 | Bizjak |
| 2003/0216907 A1 | 11/2003 | Thomas |
| 2004/0022400 A1 | 2/2004 | Magrath |
| 2004/0086144 A1 | 5/2004 | Kallen |
| 2004/0146170 A1 | 7/2004 | Zint |
| 2005/0201572 A1 | 9/2005 | Lindahl et al. |
| 2005/0249272 A1 | 11/2005 | Kirkeby et al. |
| 2005/0254564 A1 | 11/2005 | Tsutsui |
| 2006/0034467 A1 | 2/2006 | Sleboda et al. |
| 2006/0098827 A1 | 5/2006 | Paddock et al. |
| 2006/0126865 A1 | 6/2006 | Blamey et al. |
| 2006/0291670 A1 | 12/2006 | King et al. |
| 2007/0223713 A1 | 9/2007 | Gunness |
| 2007/0253577 A1 | 11/2007 | Yen et al. |
| 2008/0112576 A1 | 5/2008 | Bongiovi |
| 2008/0123870 A1 | 5/2008 | Stark et al. |
| 2008/0137881 A1 | 6/2008 | Bongiovi |
| 2008/0219459 A1 | 9/2008 | Bongiovi et al. |
| 2009/0054109 A1 | 2/2009 | Hunt |
| 2009/0062946 A1 | 3/2009 | Bongiovi et al. |
| 2009/0086996 A1 | 4/2009 | Bongiovi et al. |
| 2009/0296959 A1 | 12/2009 | Bongiovi |

FOREIGN PATENT DOCUMENTS

| | | |
|---|---|---|
| JP | 0-106876 | 4/1995 |
| JP | 2005/500768 A | 1/2005 |
| WO | WO 2006/020427 | 2/2006 |
| WO | WO 2007/092420 | 8/2007 |
| WO | WO 2009/070797 | 6/2009 |

PROCESSING OF AN AUDIO SIGNAL FOR PRESENTATION IN A HIGH NOISE ENVIRONMENT

CROSS REFERENCE TO RELATED APPLICATIONS

The present application is a continuation of, and claims priority under 35 U.S.C. §120 to, U.S. patent application Ser. No. 11/764,446, filed Jun. 18, 2007, now U.S. Pat. No. 7,519,189 which is a continuation of Ser. No. 10/914,234 filed on Aug. 10, 2004, and claims priority under 35 U.S.C. §120 to, U.S. Pat. No. 7,254,243 issued Aug. 7, 2007, both of which are expressly incorporated fully herein by reference.

FIELD OF THE INVENTION

This invention relates to apparatus for processing an audio signal and, in particular, to apparatus which is particularly useful for presenting enhanced quality sound in a high noise environment.

BACKGROUND OF THE INVENTION

The presentation of quality sound production in moving automobiles, boats and aircraft is particularly challenging due to the high noise content of the environment in which the sound is presented. The bass response in such a system is generally inadequate. The bass response can be increased ("boosted") with an equalizer, but this muffles the treble, resulting in a muffled quality audio.

In addition to muffling treble, a bass boost undesirably increases the dynamic range of the sound presentation. In a noisy environment, there is a relatively small range between the volume floor set by the noise (typically 80 dB in moving vehicles) and the volume ceiling set by the physiology of the ear. In a noisy environment, increases in the dynamic range of a sound presentation are aesthetically undesirable because they approach the volume at which sound becomes unpleasant or even painful (typically around 110 dB). Accordingly, there is a need for a new approach for processing audio signals for presentation in a high noise environment.

SUMMARY OF THE INVENTION

The electrical signal representative of the sound may be first subjected to equalization by changing the amplitude of low frequency portions corresponding to bass sounds and changing in the opposite direction the amplitude of high frequency portions corresponding to treble sounds. The equalized signal may then be compressed, and the compressed signal subjected to "mirror image" equalization which changes the magnitude of bass signals while changing the magnitude of treble signals.

In accordance with the invention, audio signals are specially processed for sound presentation in a high noise environment. The electrical signal representative of the sound is first subjected to equalization to preferentially reduce the magnitude of bass signals while increasing the magnitude of treble signals. The equalized signal is then compressed, and the compressed signal is subjected to "mirror image" equalization which increases the magnitude of bass signals while reducing the magnitude of treble signals. The resulting signal fed to the speakers provides a sound presentation of compressed volume range and a bass-rich sound spectrum. It is particularly useful for providing quality sound presentation in a high noise environment.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

DETAILED DESCRIPTION

Figure 1:
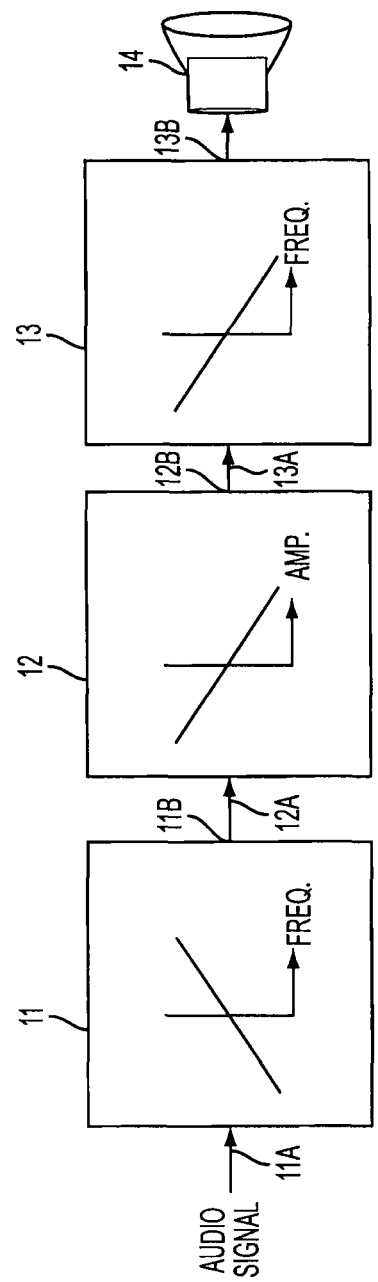
FIG. 1 is a schematic view of an audio system for presenting sound in a high noise environment.

Referring to the drawings, FIG. 1 is a schematic view of an audio system 10 for presenting sound in a high noise environment. The system 10 comprises an equalizer 11 having an input 11A and an output 11B for receiving an audio signal (preferably an analog electrical signal in the audio frequency range) and reducing the amplitude of the portion of the signal corresponding to the bass spectrum of sound while increasing the amplitude corresponding to the treble spectrum. Ideally the low audible bass portion (taken at 100 Hz) is reduced by about 10 dB, the high audible treble portion (taken at 8 kHz) is increased by about 8 dB, and the portions in between are reduced or enhanced in a linearly proportional manner, i.e. the increase is a substantially linear function of frequency. A variety of suitable equalizing circuits are known in the art. The preferred circuit for the equalizer is shown in block 11 of FIG. 2.

Referring back to FIG. 1, the equalized audio signal from 11 is applied to the input of a compressor 12. The compressor has an input 12A and an output 12B. The compressor provides a degree of amplification which is inversely related to signal amplitude. Low amplitude portions of the signal are provided with higher gain amplification than high amplitude portions with the result that the dynamic range of represented sounds is lowered. (Quiet sounds would be raised; loud sounds would be lowered). Preferably the dynamic range is reduced to 10 dB or less. A variety of compressor circuits are known. The preferred compressor for the system of FIG. 1 is shown in block 12 of FIG. 2B.

After compression, the electrical audio signal is subjected to "mirror image" equalization in mirror image equalizer 13 having an input 13A and an output 13B. Equalizer 13 increases the bass portion of the signal while reducing the treble portion. Preferably the low audible bass portion (100 Hz) is increased about 10 dB and high audible treble portion (10 kHz) is reduced about 8 dB. The intermediate portions of the signal are reduced as a substantially linear function of frequency. The equalizer 11 and the "mirror image" equalizer 13 are ideally chosen so that they have equal and opposite affects. Block 13 of FIG. 2C is a schematic diagram of a preferred "mirror image" equalization circuit for the FIG. 1 system.

After equalization, compression and mirror image equalization, the processed audio signal is applied to speaker system 14 either directly or through a multiple-band equalizer (not shown in FIG. 1) for sound presentation. The speaker system can consist of small speakers (having magnets smaller than 10 oz), for presentation of sound in a high-noise environment. Because the bass portion was reduced before compression and enhanced after compression, the sound presented by the speakers has a spectrum rich in bass tones and free of the muffling effect encountered in conventional compression. And because the dynamic range is reduced by compression, the sound can be presented within the limited volume range between the 80 dB noise floor and the 110 dB threshold of unpleasant sensation.

Figure 2A:
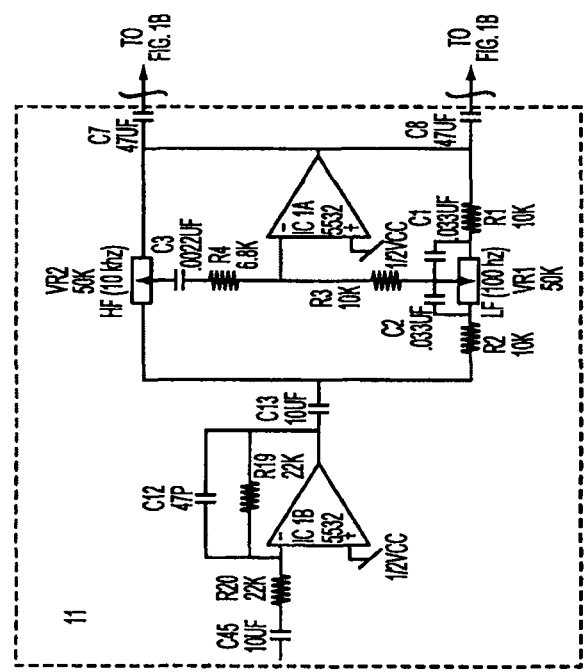
FIGS. 2A-2E are diagrams of exemplary circuits for the system of FIG. 1.
Figure 2B:
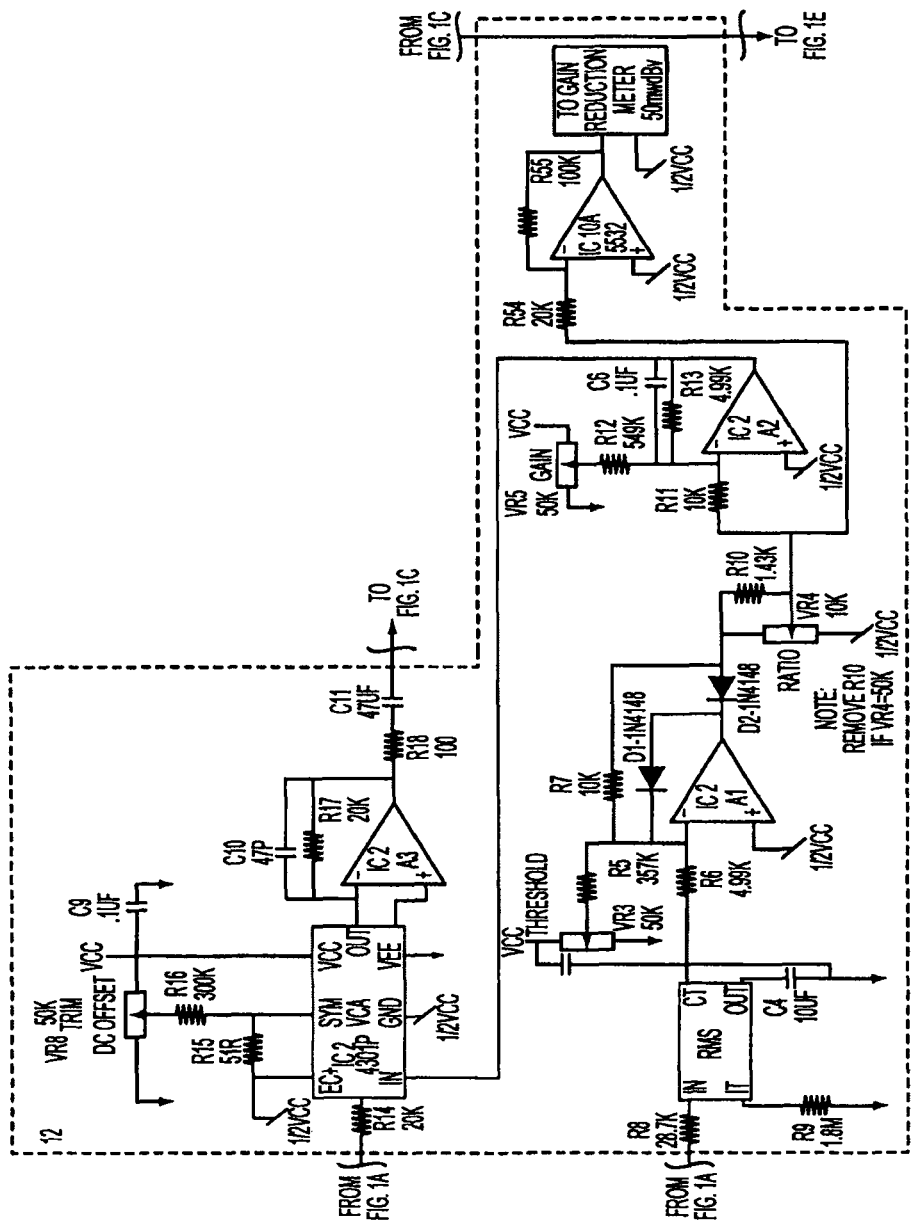
Figure 2C:
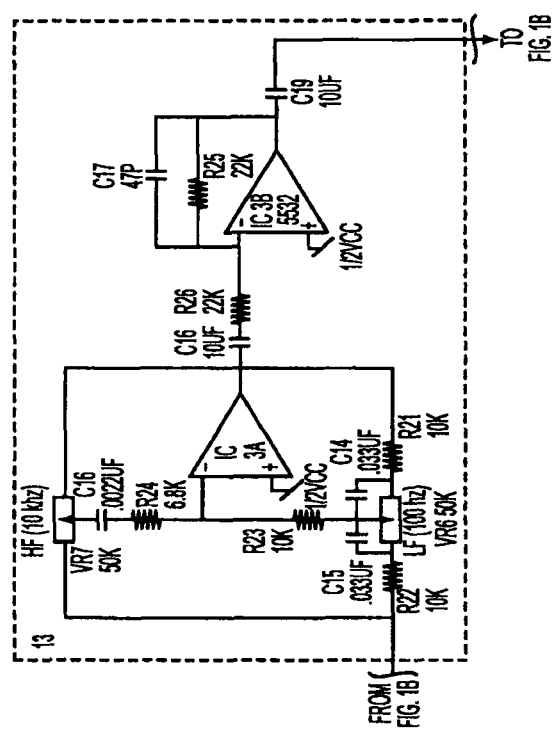
Figure 2D:
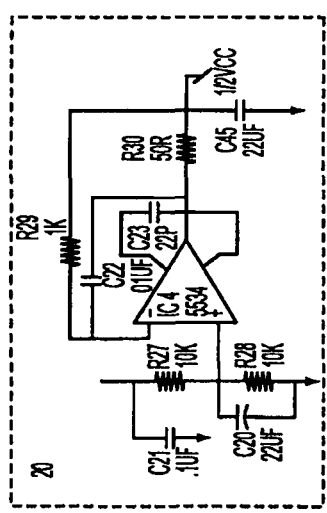

FIGS. 2A-2E are diagrams of exemplary circuits for the system of FIG. 1. The blocks in FIGS. 2A-2E are numbered to correspond to the same functional blocks in FIG. 1. All of the components in FIGS. 2A-2E are standard commercially available components. The IC encompassing the components designated VCA, RMS, A1, A2 and A3 in block 12 of FIG. 2B is available from That Semiconductor Corp. under the product designation IC 4200.

Figure 2E:
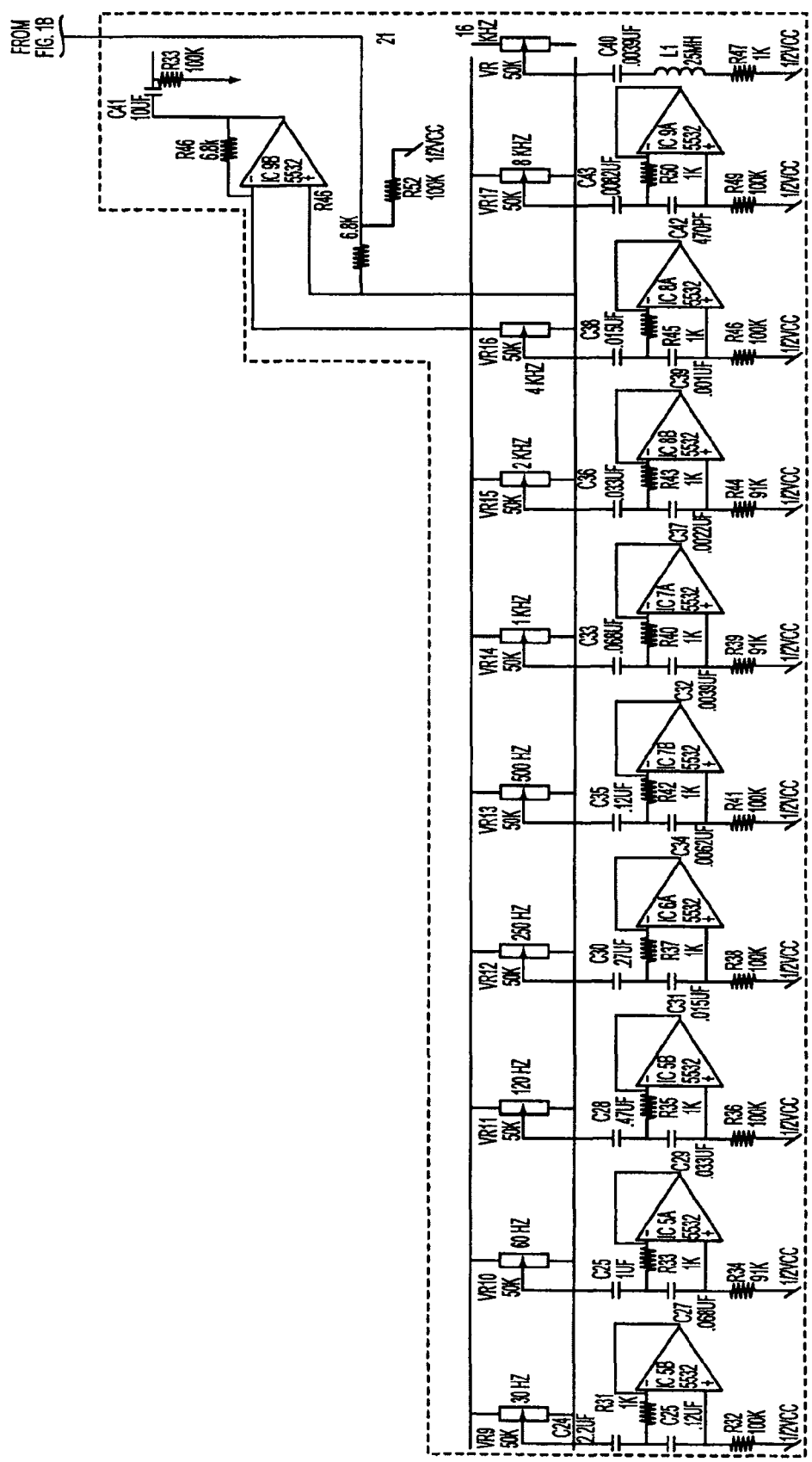

Also shown as parts of the preferred circuit are an optional power supply 20 and a 10-band graphic equalizer 21 of FIG. 2E for a specific speaker assembly. The equalizer 21 of FIG. 2E is disposed at the output of mirror image equalizer 13 of FIG. 2C.

The signal processor described herein is designed to accommodate the conversion of music composition and movie sound tracks with wide dynamic ranges to a very narrow dynamic range without distorting or altering the original work. It is particularly suited for playing music or movies in high ambient noise environments such as aircraft or boats. Additional applications include shopping malls, performance theaters, automobiles, cabaret clubs as well as high noise environment where music or sound needs to be reproduced; e.g. amusement parks and racetracks.

By using equalization and compression in this fashion, the control of the frequency response of the program materials can be altered to such a degree that it can cause a transducer to pass the sound through conventional boat and aircraft interiors without exposing the transducer to the acoustic environment.

It is to be understood that the above-described embodiments are illustrative of only a few of the many possible specific embodiments which can represent applications of the principles of the invention. Numerous and various other arrangements can be made by those skilled in the art without departing from the spirit and scope of the invention.

What is claimed is:

1. A system comprising:
    an equalizer configured to equalize a received audio signal by changing an amplitude of low frequency portions of said audio signal corresponding to audible bass sounds and changing in an opposite direction an amplitude of high frequency portions of said audio signal corresponding to audible treble sounds;
    a compressor configured to compress a dynamic range of said equalized audio signal; and
    a mirror image equalizer configured to mirror image equalize said compressed equalized audio signal by changing the amplitude of said low frequency portions of said compressed equalized audio signal and changing the amplitude of said high frequency portions of said compressed equalized audio signal.

2. The system of claim 1, further comprising a speaker system responsive to an output of said mirror image equalizer.

3. The system of claim 2, wherein said speaker system comprises speakers having magnets weighing less than about 10 oz.

4. The system of claim 1, wherein a noise environment of the system has an average noise floor in excess of about 80 dB and said compressor can compress the dynamic range of said equalized audio signal to less than about 10 dB.

5. The system of claim 1, wherein said equalizer changes the amplitude of said low frequency signal portion by about 10 dB at 100 Hz and changes the amplitude of said high frequency signal portion by about 8 dB at 8 kHz.

6. The system of claim 1, wherein said equalizer changes an amplitude of a frequency portion in between said low frequency portions and said high frequency portions as a substantially linear function of signal frequency.

7. The system of claim 1, wherein said mirror image equalizer changes the amplitude of said low frequency signal portion by about 10 dB at 100 Hz and changes the amplitude of said high frequency signal portion by about 8 dB at 8 kHz.

8. The system of claim 1, wherein said mirror image equalizer changes amplitude as a substantially linear function of signal frequency.

9. A method comprising:
    equalizing a received audio signal by changing an amplitude of low frequency portions of said audio signal corresponding to audible bass sounds and changing in an opposite direction an amplitude of high frequency portions of said audio signal corresponding to audible treble sounds;
    compressing a dynamic range of said equalized audio signal; and
    mirror image equalizing said compressed equalized audio signal by changing the amplitude of said low frequency portions of said compressed equalized audio signal and changing the amplitude of said high frequency portions of said compressed equalized audio signal.

10. The method of claim 9, further comprising a speaker system responsive to an output of said mirror image equalizing step.

11. The method of claim 10, wherein said speaker system comprises speakers having magnets weighing less than about 10 oz.

12. The method of claim 9, wherein the method is used in a noise environment has an average noise floor in excess of about 80 dB and wherein said compressing step compresses the dynamic range of said equalized audio signal to less than about 10 dB.

13. The method of claim 9, wherein said equalizing changes the amplitude of said low frequency signal portion by about 10 dB at 100 Hz and changes the amplitude of said high frequency signal portion by about 8 dB at 8 kHz.

14. The method of claim 9, wherein said equalizing changes the amplitude of a frequency portion in between said low frequency portions and said high frequency portions as a substantially linear function of signal frequency.

15. The method of claim 9, wherein said mirror image equalizing changes the amplitude of said low frequency signal portion by about 10 dB at 100 Hz and the amplitude of said high frequency signal portion by about 8 dB at 8 kHz.

16. The method of claim 9, wherein said mirror image equalizing changes amplitude as a substantially linear function of signal frequency.

* * * * *